US010817630B2

(12) United States Patent
Choi et al.

(10) Patent No.: US 10,817,630 B2
(45) Date of Patent: Oct. 27, 2020

(54) APPARATUS AND METHOD FOR ANALYZING BUILDINGS

(71) Applicant: Electronics and Telecommunications Research Institute, Daejeon (KR)

(72) Inventors: Jong-Woo Choi, Seoul (KR); Wan-Ki Park, Daejeon (KR); Il-Woo Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 365 days.

(21) Appl. No.: 15/804,925

(22) Filed: Nov. 6, 2017

(65) Prior Publication Data

US 2018/0137221 A1 May 17, 2018

(30) Foreign Application Priority Data

Nov. 17, 2016 (KR) .................. 10-2016-0153378
Jul. 31, 2017 (KR) .................. 10-2017-0097254

(51) Int. Cl.
| G06G 7/48 | (2006.01) |
| G06F 30/20 | (2020.01) |
| G06F 17/18 | (2006.01) |
| G05B 17/02 | (2006.01) |
| G05B 15/02 | (2006.01) |
| G06F 30/13 | (2020.01) |
| G06F 16/2458 | (2019.01) |

(52) U.S. Cl.
CPC ............ *G06F 30/20* (2020.01); *G05B 15/02* (2013.01); *G05B 17/02* (2013.01); *G06F 17/18* (2013.01); *G06F 30/13* (2020.01); *G05B 2219/2642* (2013.01); *G06F 16/2465* (2019.01)

(58) Field of Classification Search
None
See application file for complete search history.

(56) References Cited

U.S. PATENT DOCUMENTS

| 8,538,687 | B2 * | 9/2013 | Plocher ................. G01C 21/20 |
| | | | 701/433 |
| 9,342,928 | B2 * | 5/2016 | Rasane ................. G06T 19/003 |
| 2012/0323382 | A1 * | 12/2012 | Kamel ..................... G05F 1/66 |
| | | | 700/286 |
| 2014/0095935 | A1 * | 4/2014 | Zimmermann ..... H04L 12/2823 |
| | | | 714/33 |

(Continued)

FOREIGN PATENT DOCUMENTS

| KR | 1020110122414 A | 11/2011 |
| KR | 1020130065815 A | 6/2013 |

(Continued)

*Primary Examiner* — Rehana Perveen
*Assistant Examiner* — Nithya J. Moll
(74) *Attorney, Agent, or Firm* — William Park & Associates Ltd.

(57) ABSTRACT

Disclosed herein are an apparatus and method for analyzing a building. The apparatus for analyzing a building includes a configuration unit for configuring analysis settings for analyzing a target building; a calculation unit for calculating a distance based on similarity by acquiring information about the target building and information about a standard building depending on the analysis settings and for generating a result of analysis of the target building using the distance; and an output unit for outputting the result of analysis of the target building.

19 Claims, 15 Drawing Sheets

(56) References Cited

U.S. PATENT DOCUMENTS

2014/0107851 A1    4/2014   Yoon et al.
2014/0142905 A1    5/2014   Drees et al.
2014/0214215 A1    7/2014   Han et al.
2015/0323948 A1   11/2015   Jeong et al.

FOREIGN PATENT DOCUMENTS

| KR | 1020140048515 A | 4/2014 |
| KR | 1020140121521 A | 10/2014 |
| KR | 101553476 B1 | 9/2015 |
| KR | 101655247 B1 | 9/2016 |

\* cited by examiner

FIG. 12

| PROPERTY NAME | PROPERTY TYPE | DISTANCE TYPE | WHETHER TO APPLY SCALING | BIM | STANDARD PROFILE | WEIGHT | SCALING | DISTANCE |
|---|---|---|---|---|---|---|---|---|
| PROPERTY 1 | STRING | EXCLUSION FROM ANALYSIS | - | $TP_1$ | $SP_1$ | $\alpha_1$ | - | - |
| PROPERTY 2 | STRING | XOR | X | $TP_2$ | $SP_2$ | $\alpha_2$ | - | $D_2 = \alpha_2 \delta_{TP_2, SP_2}$ |
| PROPERTY 3 | NUMERIC | EXCLUSION FROM ANALYSIS | - | $TP_3$ | $SP_3$ | $\alpha_3$ | - | - |
| PROPERTY 4 | NUMERIC | SCALING | - | $TP_4$ | $SP_4$ | $\alpha_4$ | $S_4 = \alpha_4 \times SP_4/TP_4$ | - |
| PROPERTY 5 | NUMERIC | SUBTRACTION | O | $TP_5$ | $SP_5$ | $\alpha_5$ | - | $D_5 = \alpha_5 \lvert S \times TP_5 - SP_5 \rvert$ |
| PROPERTY 6 | DATASET $[1, M_6]$ | EXCLUSION FROM ANALYSIS | - | $TP_6$ | $SP_6$ | $\alpha_6$ | - | - |
| PROPERTY 7 | DATASET $[1, M_7]$ | MANHATTAN | O | $TP_7$ | $SP_7$ | $\alpha_7$ | - | $D_7 = \alpha_7 \sum_{j=1}^{M_7} \lvert S \times TP_{7j} - SP_{7j} \rvert$ |
| PROPERTY 8 | DATASET $[1, M_8]$ | EUCLIDEAN | X | $TP_8$ | $SP_8$ | $\alpha_8$ | - | $D_8 = \alpha_8 \sqrt{\sum_{j=1}^{M_8} (TP_{8j} - SP_{8j})^2}$ |
| PROPERTY 9 | DATASET $[1, M_9]$ | CHEBYSHEV | X | $TP_9$ | $SP_9$ | $\alpha_9$ | - | $D_9 = \alpha_9 \max_j (\lvert TP_{9j} - SP_{9j} \rvert)$ |
| PROPERTY 10 | DATASET $[1, M_{10}]$ | MINKOWSKI (WITH $p_{10}$) | O | $TP_{10}$ | $SP_{10}$ | $\alpha_{10}$ | - | $D_{10} = \alpha_{10} (\sum_{j=1}^{M_{10}} \lvert S \times TP_{10j} - SP_{10j} \rvert^{p_{10}})^{1/p_{10}}$ |
| ... | ... | ... | ... | ... | ... | ... | ... | ... |
| PROPERTY i | | | | $TP_i$ | $SP_i$ | $\alpha_i$ | $S_i = f_{S,i}(TP_i, SP_i, \alpha_i)$ | $D_i = f_{D,i}(TP_i, SP_i, S, \alpha_i)$ |
| ... | | | | | | | | |
| PROPERTY N | | | | | | | | |
| TOTAL | | | | | | | $S = \prod_{i=1}^{N} S_i$ | $D = (\sum_{i=1}^{N} D_i^p)^{1/p}$ |

APPARATUS AND METHOD FOR ANALYZING BUILDINGS

CROSS REFERENCE TO RELATED APPLICATIONS

This application claims the benefit of Korean Patent Application No. 10-2016-0153378, filed Nov. 17, 2016, and No. 10-2017-0097254, filed Jul. 31, 2017, which are hereby incorporated by reference in their entirety into this application.

BACKGROUND OF THE INVENTION

1. Technical Field

The present invention relates generally to a building energy management system, and more particularly to technology for checking and evaluating a building management state.

2. Description of the Related Art

Energy-consuming facilities in a building may be managed in consideration of the demand and supply of energy and their effects on the environment. Buildings have facilities, such as heating and cooling systems, including a boiler, a heat pump, a water heater, and the like, a ventilation system including a fan and the like, installed lighting, a plumbing system, elevators, and the like. Such facilities and home appliances used by residents of buildings consume a considerable amount of power. The amount of energy consumed by buildings is roughly equivalent to 40% of global energy production.

A Building Energy Management System (BEMS) may monitor the amount of energy consumed by facilities in a building in real time. Here, the BEMS may control the internal environment of a building, such as the temperature, humidity, and the like thereof, so as to be kept at desirable levels by checking abnormal operation of facilities and providing solutions therefor. That is, the BEMS may optimize the total energy consumption of a building. Also, the BEMS may check building management and energy consumption in real time and provide a function of optimizing the same.

The BEMS may check the operation of facilities in a building in real time, but a lot of factors need to be considered in order to construct and use the BEMS.

First, targets to be checked by the BEMS are active elements; that is, they are controllable and the operation thereof may change in real time. Passive elements that greatly affect energy efficiency but cannot be monitored in real time, such as the material of the external walls of a building, a window area, and the like, are excluded from the targets of the BEMS.

Also, the BEMS requires various sensors for real-time performance analysis. If the profit from the BEMS is less than the expenses of installing sensors and constructing a network, it results in a financial loss.

Finally, because real-time performance and failure theoretically analyzed by the BEMS may differ from levels that are acceptable in an actual building, unnecessary diagnosis may be made.

In order to easily check the energy consumption of a building without high investment costs, the energy consumption of a building may be simply compared with that of other buildings.

When the energy consumption of a building is compared with that of other buildings, there is no agreed-upon method for finding a building to be used to perform the energy consumption comparison. There may be a method in which buildings having the same purpose or buildings in the same area are gathered as a set, and the energy consumption statistics of the set are compared with the energy consumption of a target building. However, the method of simply using a set of buildings having the same attributes is not sufficient to examine and evaluate the target building.

Also, the method takes no account of the possibility that a set of buildings having the same purpose or buildings in the same area, which are to be compared with a target building, may not exist, or the possibility that all of the buildings in a set have problematically high energy consumption.

Meanwhile, Korean Patent No. 10-1655247, titled "Energy analysis system using BEMS data", relates to an energy analysis system using a Building Energy Management System (BEMS) data and a method using the same. The energy analysis system is configured to receive data from a BEMS database at regular intervals, to configure a rule set for detecting different errors based on the received data, to generate an alarm signal depending on the error detection rule set, to notify an administrator of the alarm signal, and to store a history of the occurrence of the alarm signal. Accordingly, using the energy analysis system and method using BEMS data, energy-wasting elements in a building are automatically analyzed and the analysis result is quickly reflected in the management of the building, whereby energy consumption in the building may be reduced.

SUMMARY OF THE INVENTION

An object of the present invention is to precisely examine the state of a building by comparing information about the building with information about another building.

Another object of the present invention is to precisely analyze information about a building using a standard building profile based on a simulation.

A further object of the present invention is to reduce the expense for constructing a building management system by analyzing information about a building.

Yet another object of the present invention is to provide a method for resolving the abnormal state of a building and reducing energy consumption.

In order to accomplish the above objects, an apparatus for analyzing a building according to an embodiment of the present invention includes a configuration unit for configuring analysis settings for analyzing a target building; a calculation unit for calculating a distance based on a similarity by acquiring information about the target building and information about a standard building depending on the analysis settings and for generating a result of analysis of the target building using the distance; and an output unit for outputting the result of analysis of the target building.

Here, the information about the target building may be a Building Information Model (BIM) generated using attribute information and state information of the target building.

Here, the information about the standard building may be a standard building profile generated using attribute information and state information of the standard building for obtaining a similarity with the target building.

Here, the standard building profile may be generated by combining a building energy consumption prediction result with the attribute information and the state information of the standard building.

Here, the building energy consumption prediction result may be generated by running a building energy simulation with data acquired by combining the attribute information and the state information of the standard building.

Here, the calculation unit may calculate a distance based on similarities between the building information model of the target building and representative profiles that represent building groups, among standard building profiles of the standard building.

Here, the calculation unit may select a building group corresponding to a representative profile based on which the calculated distance is equal to or less than a preset value.

Here, the calculation unit may generate the analysis result by calculating a distance based on the similarities between the building information model of the target building and standard building profiles included in the selected building group.

Here, the calculation unit may calculate the distance based on the similarity by applying at least one of scaling information and a weight to a value acquired by comparing each property of the building information model of the target building with that of the standard building.

Here, the calculation unit may calculate a local information scaling value using a weight and a ratio between a value of a property of the target building and that of the standard building.

Here, the calculation unit may calculate a global information scaling value by multiplying local information scaling values calculated for respective properties.

Here, the calculation unit may calculate a local information distance using a distance calculation equation based on a type of the property.

Here, when the type of the property is a string, the calculation unit may calculate the local information distance depending on whether string values of two properties are equal to each other using an XOR function.

Here, when the type of the property is a number, the calculation unit may calculate the local information distance by multiplying a weight by a difference between values of two properties.

Here, when the type of the property is a dataset, the calculation unit may calculate the local information distance for a dataset using a Minkowski distance calculation algorithm.

Here, the calculation unit may calculate a global information distance for a dataset of the local information distances calculated for the respective properties using a Minkowski distance calculation algorithm.

Here, the output unit may provide an Energy Conservation Measure (ECM) for the target building based on the analysis result.

Also, in order to accomplish the above objects, a method for analyzing a building, in which an apparatus for analyzing a building is used, according to an embodiment of the present invention includes configuring analysis settings for analyzing a target building; calculating a distance based on a similarity by acquiring information about the target building and information about a standard building depending on the analysis settings, and generating a result of analysis of the target building using the distance; and outputting the result of analysis of the target building.

Here, generating the result may be configured to calculate the distance based on the similarity by applying at least one of scaling information and a weight to a value acquired by comparing each property of a building information model of the target building with that of the standard building.

Here, generating the result may be configured to calculate the distance based on the similarity using a distance calculation equation based on a type of the property.

BRIEF DESCRIPTION OF THE DRAWINGS

The above and other objects, features and advantages of the present invention will be more clearly understood from the following detailed description taken in conjunction with the accompanying drawings, in which:

FIG. 12 is a view that shows a distance calculation algorithm according to an embodiment of the present invention;

DESCRIPTION OF THE PREFERRED EMBODIMENTS

Figure 1:
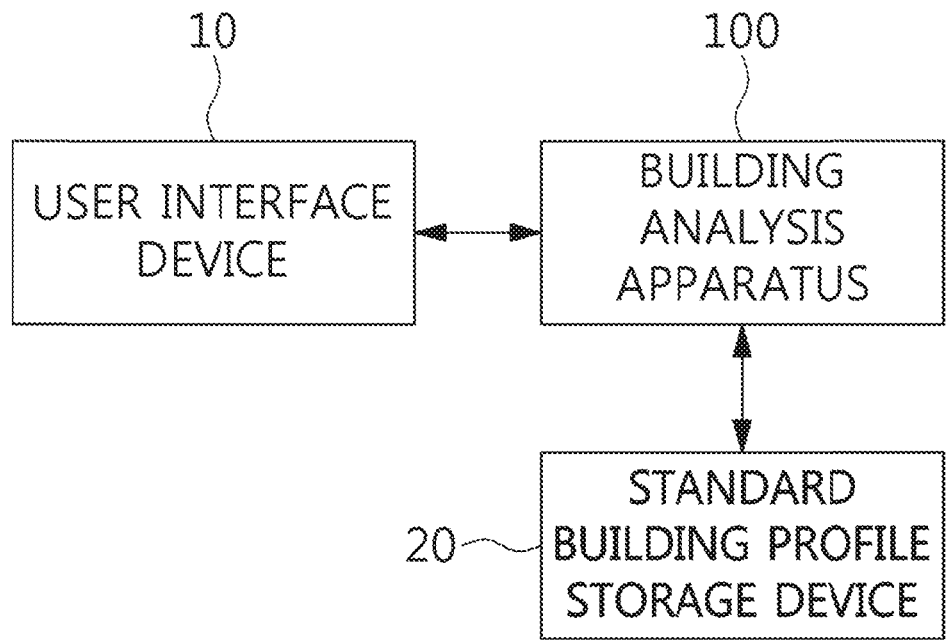
FIG. 1 is a block diagram that shows a building analysis system according to an embodiment of the present invention.

The present invention will be described in detail below with reference to the accompanying drawings. Repeated descriptions and descriptions of known functions and configurations which have been deemed to make the gist of the present invention unnecessarily obscure will be omitted below. The embodiments of the present invention are intended to fully describe the present invention to a person having ordinary knowledge in the art to which the present invention pertains. Accordingly, the shapes, sizes, etc. of components in the drawings may be exaggerated in order to make the description clearer.

Throughout this specification, the terms "comprises" and/or "comprising", and "includes" and/or "including" specify the presence of stated elements but do not preclude the presence or addition of one or more other elements unless otherwise specified.

Hereinafter, a preferred embodiment of the present invention will be described in detail with reference to the accompanying drawings.

FIG. 1 is a block diagram that shows a building analysis system according to an embodiment of the present invention.

Referring to FIG. 1, the building analysis system according to an embodiment of the present invention includes a user interface device 10, a standard building profile storage device 20, and a building analysis apparatus 100.

The user interface device 10 may receive the attribute information and the state information of a target building from a user and generate a Building Information Model (BIM).

Here, the user interface device 10 may request the building analysis apparatus 100 to analyze the target building by delivering the generated BIM thereto.

Also, the user interface device 10 may receive the result of analysis of the target building from the building analysis apparatus 100.

Here, the user interface device 10 may output the result of analysis of the target building to the user.

Here, the user interface device 10 may provide an Energy Conservation Measure (ECM) for the target building based on the analysis result.

The standard building profile storage device 20 may store a standard building profile for each building group.

Here, the standard building profile storage device 20 may store standard building attribute information and standard building state information for generating a standard building profile.

Also, the standard building profile storage device 20 may generate a standard building profile using the standard building attribute information and the standard building state information.

Here, the standard building profile storage device 20 may generate a building energy consumption prediction result by running a building energy simulation with data acquired by combining the standard building attribute information with the standard building state information.

Here, the standard building profile storage device 20 may generate a standard building profile by combining the building energy consumption prediction result with a combination of the standard building attribute information and the standard building state information.

The building analysis apparatus 100 may perform building analysis by acquiring information about the target building and information about the standard building respectively from the user interface device 10 and the standard building profile storage device 20.

Here, the building analysis apparatus 100 may configure settings in order to analyze the target building.

Here, the building analysis apparatus 100 may acquire information about the target building from the user interface device 10 by requesting the same from the user interface device 10 depending on the settings.

Here, the building analysis apparatus 100 may acquire information about the standard building from the standard building profile storage device 20 by requesting the same from the standard building profile storage device 20 depending on the settings.

Here, the building analysis apparatus 100 may calculate a distance based on the similarity between the target building and the standard building.

Here, the building analysis apparatus 100 may generate an analysis result for the target building using the distance.

Here, the building analysis apparatus 100 may output the analysis result.

Here, the building analysis apparatus 100 may provide an Energy Conservation Measure (ECM) for the target building based on the analysis result.

Here, the building analysis apparatus 100 may deliver the analysis result to the user interface device 10.

Figure 2:
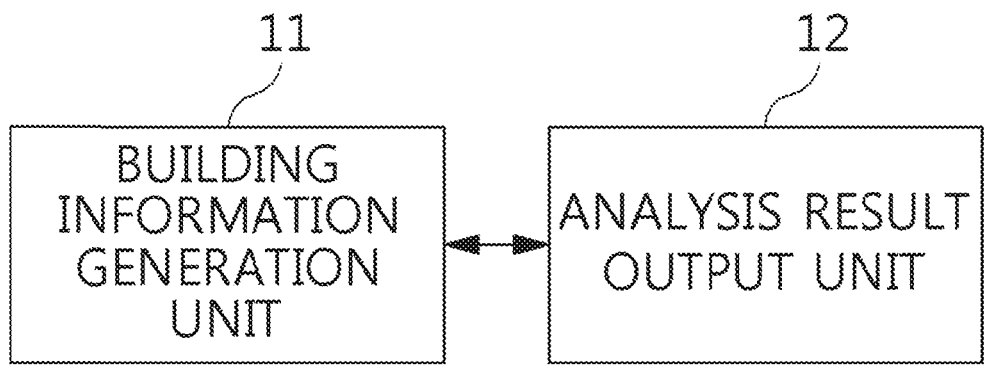
FIG. 2 is a block diagram that shows a user interface device according to an embodiment of the present invention.
Figure 3:
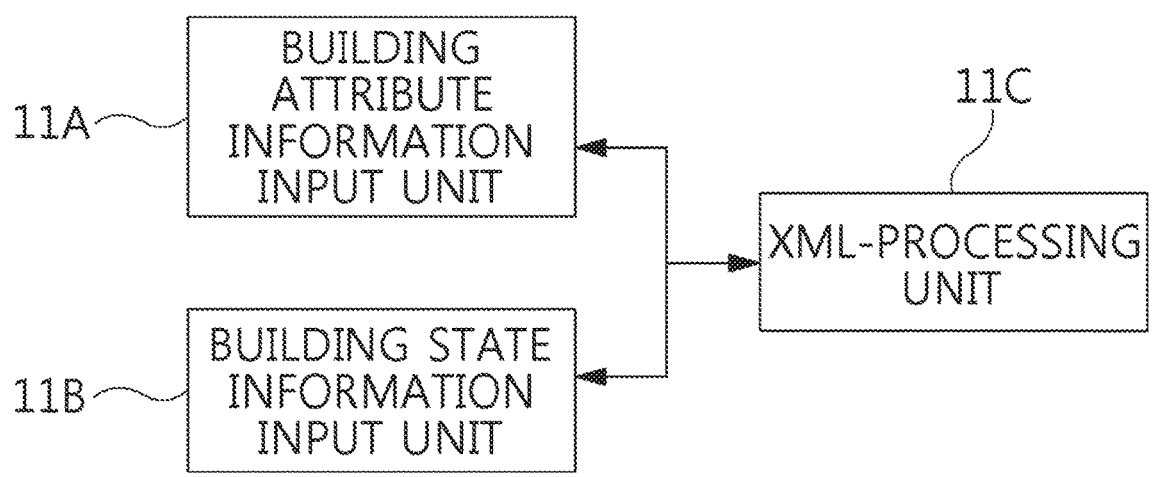
FIG. 3 is a block diagram that specifically shows an example of the building information generation unit illustrated in FIG. 2.
Figure 4:
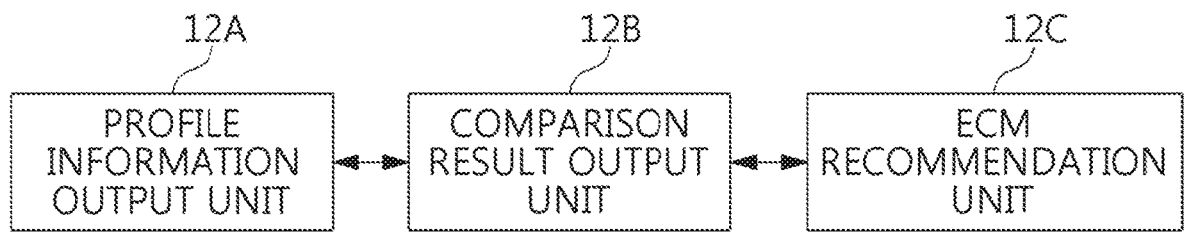
FIG. 4 is a block diagram that specifically shows an example of the analysis result output unit illustrated in FIG. 2.

FIG. 2 is a block diagram that shows a user interface device according to an embodiment of the present invention. FIG. 3 is a block diagram that specifically shows an example of the building information generation unit illustrated in FIG. 2. FIG. 4 is a block diagram that specifically shows an example of the analysis result output unit illustrated in FIG. 2.

Referring to FIG. 2, the user interface device 10 according to an embodiment of the present invention includes a building information generation unit 11 and an analysis result output unit 12.

The building information generation unit 11 may receive the attribute information and the state information of a target building from a user and generate a Building Information Model (BIM).

Here, the building information generation unit 11 may request the building analysis apparatus 100 to analyze the target building by sending the BIM of the target building thereto.

The analysis result output unit 12 may output the result of analysis of the target building, which is received from the building analysis apparatus 100, to the user.

Here, the analysis result output unit 12 may provide an Energy Conservation Measure (ECM) for the target building based on the analysis result.

The user interface device 10 according to an embodiment of the present invention may be a terminal device, such as a computing device, a smart device, or the like for receiving information about the target building from a user and sending the generated building information model.

Also, the user interface device 10 may be a storage device, a USB device, or the like, which stores only the building information model. In this case, the user interface device 10 may include a storage unit for storing a building information model and an interface unit for directly transmitting information or a data communication unit for transmitting information via a network.

Referring to FIG. 3, the building information generation unit 11 may include a building attribute information input unit 11A, a building state information input unit 11B, and an XML-processing unit 11C.

The building attribute information input unit 11A may receive building attribute information from a user.

The building state information input unit 11B may receiving building state information from a user.

The XML-processing unit 11C may generate a Building Information Model (BIM) by analyzing the building attribute information and the building state information, which are input in a structured form, such as eXtensible Markup Language (XML) or JavaScript Object Notation (JSON).

Here, the XML-processing unit 11C may request the building analysis apparatus 100 to analyze the target building by sending the BIM of the target building thereto.

Referring to FIG. 4, the analysis result output unit 12 may include a profile information output unit 12A, a comparison result output unit 12B, and an ECM recommendation unit 12C.

The profile information output unit 12A may output information about standard building profiles that are used for comparison and analysis of the target building, using the analysis result received from the building analysis apparatus 100.

The comparison result output unit 12B may output diagnosis, analysis and statistical information as a result of comparing the standard building with the target building based on the analysis result.

The ECM recommendation unit 12C may provide an Energy Conservation Measure (ECM) for normalizing the state of the target building based on the analysis result.

Figure 5:
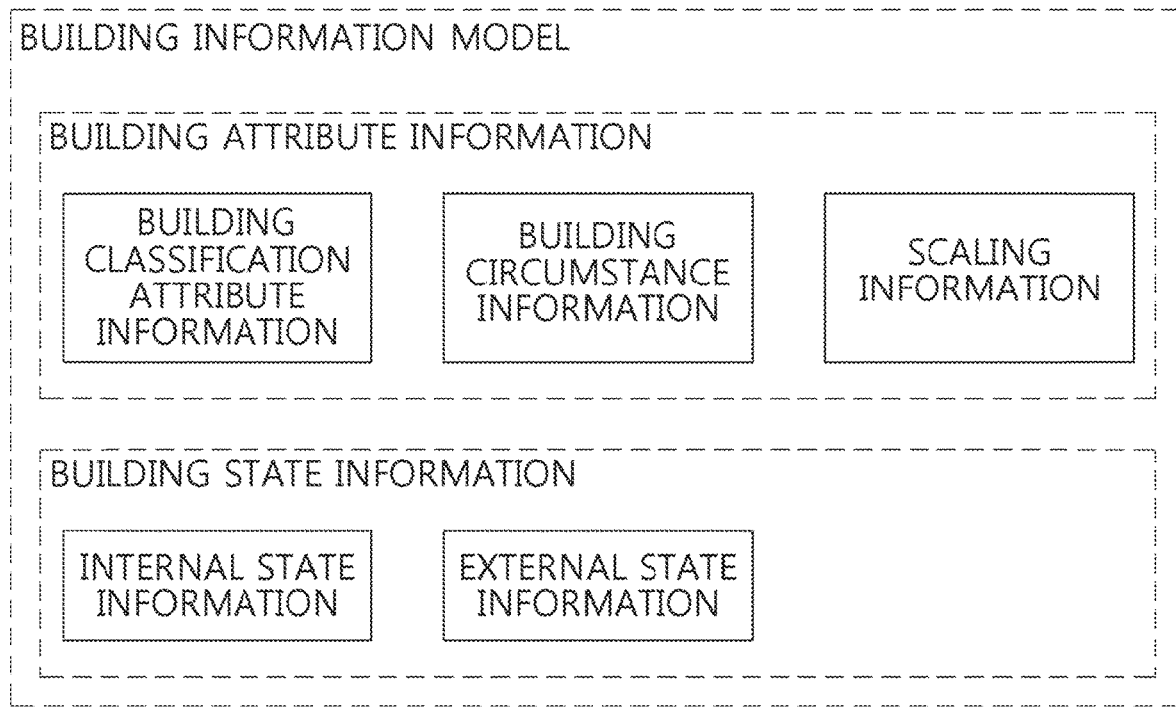
FIG. 5 is a view that shows a building information model according to an embodiment of the present invention.

FIG. 5 is a view that shows a building information model according to an embodiment of the present invention.

FIG. 5 specifically shows an example of a Building Information Model (BIM) generated by the user interface device 10.

Here, the BIM may include building attribute information and building state information.

The building attribute information may include building classification attribute information, building circumstance information, and scaling information.

The building classification attribute information may be information that is used to categorize buildings and to thereby generate building groups.

That is, the building classification attribute information may be the most fundamental attribute information of a building.

For example, the building classification attribute information may include information about the position of a building, such as a longitude, a latitude, an altitude, and the like, information about the purpose of the building, such as a public building, a hospital, a school, an office, or the like, and information about the climate of the building, such as a mild climate, a cold climate, an arid climate, a wet climate, or the like.

Here, information included in the building classification attribute information may be of a string type, or may be of a numeric type in order to represent the average temperature, a temperature difference, or the like.

The building circumstance information may be attribute information that differs depending on the building itself.

For example, the building circumstance information may be information for representing a value that varies in different buildings, such as the average number of occupants, the average energy consumption, the average energy cost, and the like.

Here, from the aspect of energy, the building circumstance information may be categorized into energy sinks that consume energy and energy sources that supply energy.

For example, attributes categorized as energy sinks may be the material of walls related to building insulation, the material of windows, the number, the consumption rates, and the average operation time of energy-consuming facilities, and the like.

Attributes categorized as energy sources may be the number, the consumption rates, and the average operation time of energy production and storage facilities, and the like.

Here, the building circumstance information may have a string value for representing the material of a wall or the like, or may have a numeric value for representing the number of occupants or the like.

The scaling information may be attribute information for correction, that is, may be used to compensate for an attribute information difference generated due to a difference in the size or area of buildings.

The scaling information may be used to correct building attribute information in consideration of energy consumption based on the size of a building.

For example, when two buildings of different heights are compared with each other, it is predicted that the higher building would consume more energy.

Accordingly, the scaling information may include attribute information having a numeric value, such as the number of stories in a building, the floor area, the area of a wall, the area of a rooftop, the area of a window and the average occupation time.

Here, because information included in the scaling information is closely related to energy consumption, the information may also be included in the energy sink of the building circumstance information.

Here, when information included in the scaling information is included in the building circumstance information, correction of the building circumstance information using the scaling information may not be performed.

The building attribute information is information having a certain scalar value, but the building state information may have a value of a dataset type, which is a set of scalar values.

The building state information may have a value that varies over time, and all of the varying values may be included in the state information.

Here, the building state information may include internal state information and external state information.

The internal state information may be information about the state inside a building.

For example, the internal state information may include hourly, daily, weekly, and monthly energy consumption measured in real time, the number of occupants, information about whether the building is being used or not, and the like.

The external state information may be information about the state outside the building.

For example, the external state information may include climate information, such as hourly, daily, weekly, and monthly temperature and humidity measured in real time, and external environment information, such as the price of energy and the like.

Figure 6:
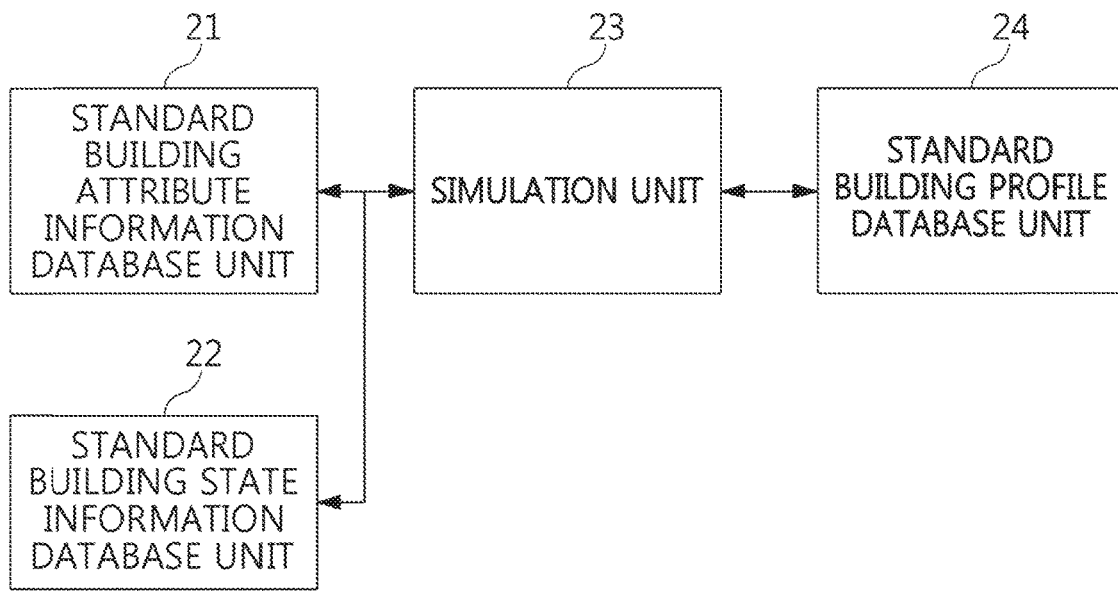
FIG. 6 is a block diagram that shows a standard building profile storage device according to an embodiment of the present invention.

FIG. 6 is a block diagram that shows a standard building profile storage device according to an embodiment of the present invention.

A standard building profile may correspond to a Building Information Model (BIM) of a standard building.

That is, the standard building profile may correspond to the building information model of buildings that may become standards for building analysis.

The standard buildings that become standards for building analysis may be buildings that are managed properly without wasting energy. In order to generate a standard building profile, it is possible to find actual buildings and collect information therefrom. However, it may be difficult to find a building managed without wasting energy and to collect building information thereon. Also, the collected information itself may be problematic, and if very few standard buildings are found, a valid analysis result may not be acquired.

In order to solve these problems, the standard building profile storage device 20 according to an embodiment of the present invention may generate a standard building profile based on a building energy simulation.

Referring to FIG. 6, the standard building profile storage device 20 according to an embodiment of the present invention may include a standard building attribute information database unit 21, a standard building state information database unit 22, a simulation unit 23, and a standard building profile database unit 24.

The standard building attribute information database unit 21 may store the attribute information of a standard building.

For example, the standard building attribute information may include building classification attribute information, building circumstance information, and scaling information.

The building classification attribute information may include information about the position, the purpose, and the climate of a building.

The building circumstance information may include information about the material of a building, and the number, the energy consumption rates, and the average operation time of energy-consuming facilities.

The scaling information may include information about the number of stories, the area, and the average occupation time.

The standard building state information database unit 22 may store the state information of the standard building.

For example, the standard building state information may include internal state information and external state information.

The internal state information may include information about the number of occupants, observed in real time, and about whether the building is being used.

The external state information may include information about climate and the price of energy observed in real-time.

However, unlike target building state information, the standard building state information may not include information about energy consumption of a building.

The information about the energy consumption of a building may be generated through a building energy simulation.

The simulation unit 23 may generate simulation input data by combining the standard building attribute information and the standard building state information.

Here, the simulation unit 23 may generate a building energy consumption prediction result by running a building energy simulation with the simulation input data.

Here, the simulation unit 23 may generate a standard building profile by combining the simulation input data with the building energy consumption prediction result.

That is, the simulation unit 23 may generate multiple standard building profiles using different combinations of the standard building attribute information and the standard building state information.

Here, the simulation unit 23 may deliver the standard building profiles to the standard building profile database unit 24 so as to be stored therein.

Here, the simulation unit 23 may send the standard building profiles to the building analysis apparatus 100.

Here, the simulation unit 23 may be a simulator for running a real-time simulation for the whole building, such as Energy Plus, TRNSYS, ESP-r, or the like.

Here, the simulation unit 23 may be modified simulation software and may further include an additional module according to need.

The standard building profile database unit 24 may receive the standard building profiles generated by the simulation unit 23 and store the same therein.

The standard building profile storage device 20 according to an embodiment of the present invention may be a computing device, a server device, a database device, or the like for storing standard building profiles generated using the attribute information and the state information of a standard building, stored in the database.

Also, the standard building profile storage device 20 may be a storage device or a USB device that stores only standard building profiles. In this case, the standard building profile storage device 20 may include a profile storage unit for storing standard building profiles and an interface unit for directly transmitting information or a data communication unit for transmitting information via a network.

Figure 7:
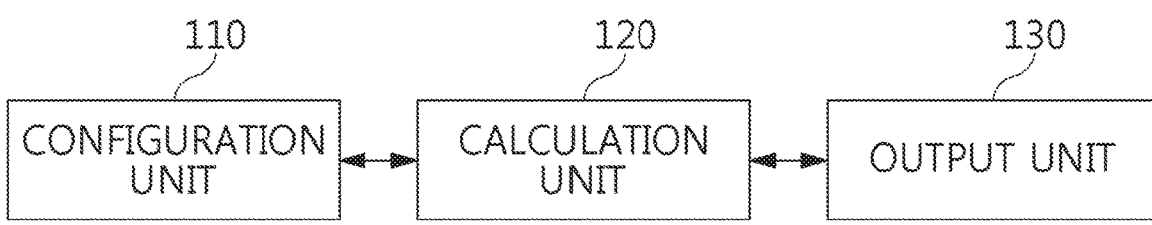
FIG. 7 is a block diagram that shows a building analysis apparatus according to an embodiment of the present invention.
Figure 8:
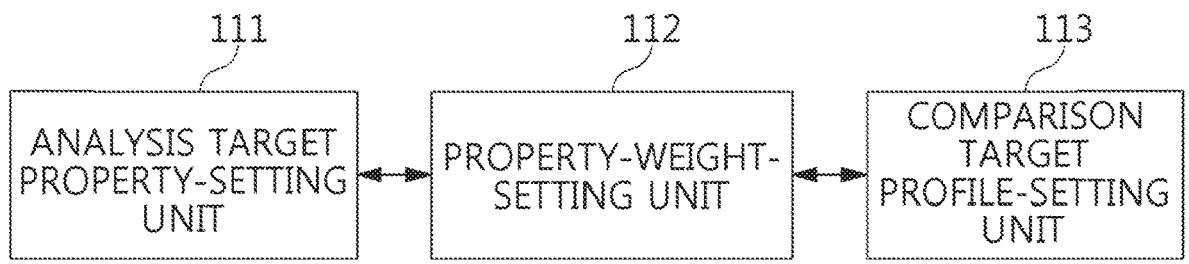
FIG. 8 is a block diagram that specifically shows an example of the configuration unit illustrated in FIG. 7.
Figure 9:
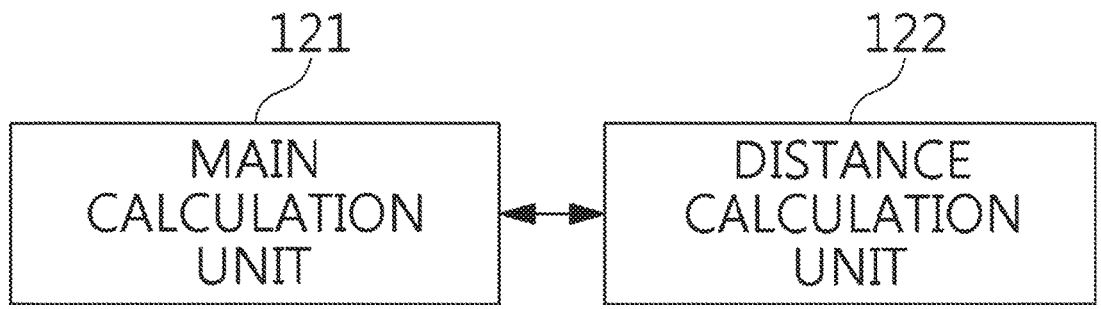
FIG. 9 is a block diagram that specifically shows an example of the calculation unit illustrated in FIG. 7.
Figure 10:
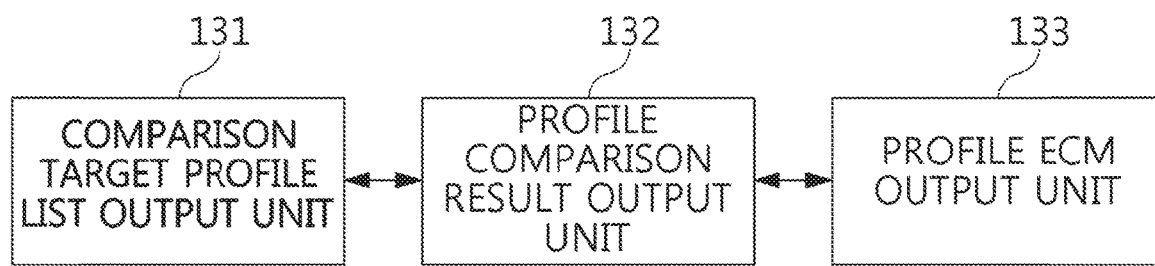
FIG. 10 is a block diagram that specifically shows an example of the output unit illustrated in FIG. 7.

FIG. 7 is a block diagram that shows a building analysis apparatus according to an embodiment of the present invention. FIG. 8 is a block diagram that specifically shows an example of the configuration unit illustrated in FIG. 7. FIG. 9 is a block diagram that specifically shows an example of the calculation unit illustrated in FIG. 7. FIG. 10 is a block diagram that specifically shows an example of the output unit illustrated in FIG. 7.

Referring to FIG. 7, the building analysis apparatus 100 according to an embodiment of the present invention includes a configuration unit 110, a calculation unit 120, and an output unit 130.

Here, the building analysis apparatus 100 may further include an interface unit for interfacing with a computing device, a terminal device, a storage device, a USB device, a server device, and the like that store building information models and standard building profiles therein.

Here, the interface unit may receive a building information model and a standard building profile from the computing device, the terminal device, the storage device, the USB device, the server device, and the like, which store building information models and standard building profiles.

Here, the interface unit may receive the building information model of a target building and the standard building profile of a standard building by being directly connected with the user interface device 10 and the standard building profile storage device 20 or by being connected therewith via a network.

The configuration unit 110 may configure analysis settings for analyzing a target building.

Referring to FIG. 8, the configuration unit 110 may include an analysis target property-setting unit 111, a property-weight-setting unit 112, and a comparison target profile-setting unit 113.

The analysis target property-setting unit 111 may set the type of property, whether to include the property in the analysis, and the method for analyzing the property for each property included in a building information model, the analysis of which is requested by the user interface device 10.

Here, the analysis target property-setting unit 111 may enable automatic settings depending on preset conditions, or may manually configure settings by receiving information from a user.

The property-weight-setting unit 112 may set a weight for a property that is determined to be included in the analysis.

Here, the property-weight-setting unit 112 may enable automatic settings depending on a preset weight, or may manually set a weight by receiving the weight from a user.

The comparison target profile-setting unit 113 may configure settings for selecting standard building profiles to be compared with the building information model of the target building.

Here, the comparison target profile-setting unit 113 may enable automatic settings depending on preset conditions, or may manually configure settings by receiving information from a user.

The calculation unit 120 may calculate a distance based on the similarity between the target building and the standard building and generate an analysis result for the target building using the distance.

Referring to FIG. 9, the calculation unit 120 may include a main calculation unit 121 and a distance calculation unit 122.

The main calculation unit 121 may acquire the building information model of the target building, analysis of which is requested by the user interface device 10.

Here, the main calculation unit 121 may acquire a standard building profile that is selected depending on the analysis settings, configured by the configuration unit 110, from the standard building profile storage device 20 by requesting the same therefrom.

Here, the main calculation unit 121 may acquire the representative profiles of respective building groups by requesting the same depending on the analysis settings.

Here, the main calculation unit 121 may request the distance calculation unit 122 to calculate a distance based on the similarity between the acquired building information model and the representative profiles of building groups by delivering the building information model and the representative profiles of building groups thereto.

The distance calculation unit 122 may calculate a distance based on the similarity between the building information model and the standard building profile.

Here, the distance calculation unit 122 may calculate the distance based on the similarity between the building information model and the representative profile of each building group, which are delivered from the main calculation unit 121.

Here, the distance calculation unit 122 may deliver the result of calculation of the distance based on the similarity to the main calculation unit 121.

Also, the main calculation unit 121 may select a building group corresponding to a representative profile based on which the calculated distance is equal to or less than a preset value.

Here, the main calculation unit 121 may acquire a standard building profile included in the selected building group from the standard building profile storage device 20 by requesting the same therefrom.

Here, the main calculation unit 121 may request the distance calculation unit 122 to calculate a distance based on the similarity between the building information model and the standard building profile included in the corresponding building group by delivering the building information model and the standard building profile thereto.

Here, the distance calculation unit 122 may calculate the distance based on the similarity between the building information model and the standard building profile included in the corresponding building group.

Here, the distance calculation unit 122 may deliver the result of calculation of the distance based on the similarity to the main calculation unit 121.

Here, the main calculation unit 121 may generate an analysis result using the acquired result of calculation of the distance.

Here, the main calculation unit 121 may deliver the generated analysis result to the output unit 130.

The output unit 130 may output the result of analysis of the target building.

Here, the output unit 130 may deliver the analysis result to the user interface device 10.

Referring to FIG. 10, the output unit 130 may include a comparison target profile list output unit 131, a profile comparison result output unit 132, and a profile ECM output unit 133.

The comparison target profile list output unit 131 may output information about standard building profiles for comparison with the target building, using the analysis result.

The profile comparison result output unit 132 may output diagnosis, analysis, and statistical information acquired by comparing the target building with the standard building based on the analysis result.

The profile ECM output unit 133 may provide an Energy Conservation Measure (ECM) for normalizing the state of the target building based on the analysis result.

Figure 11:
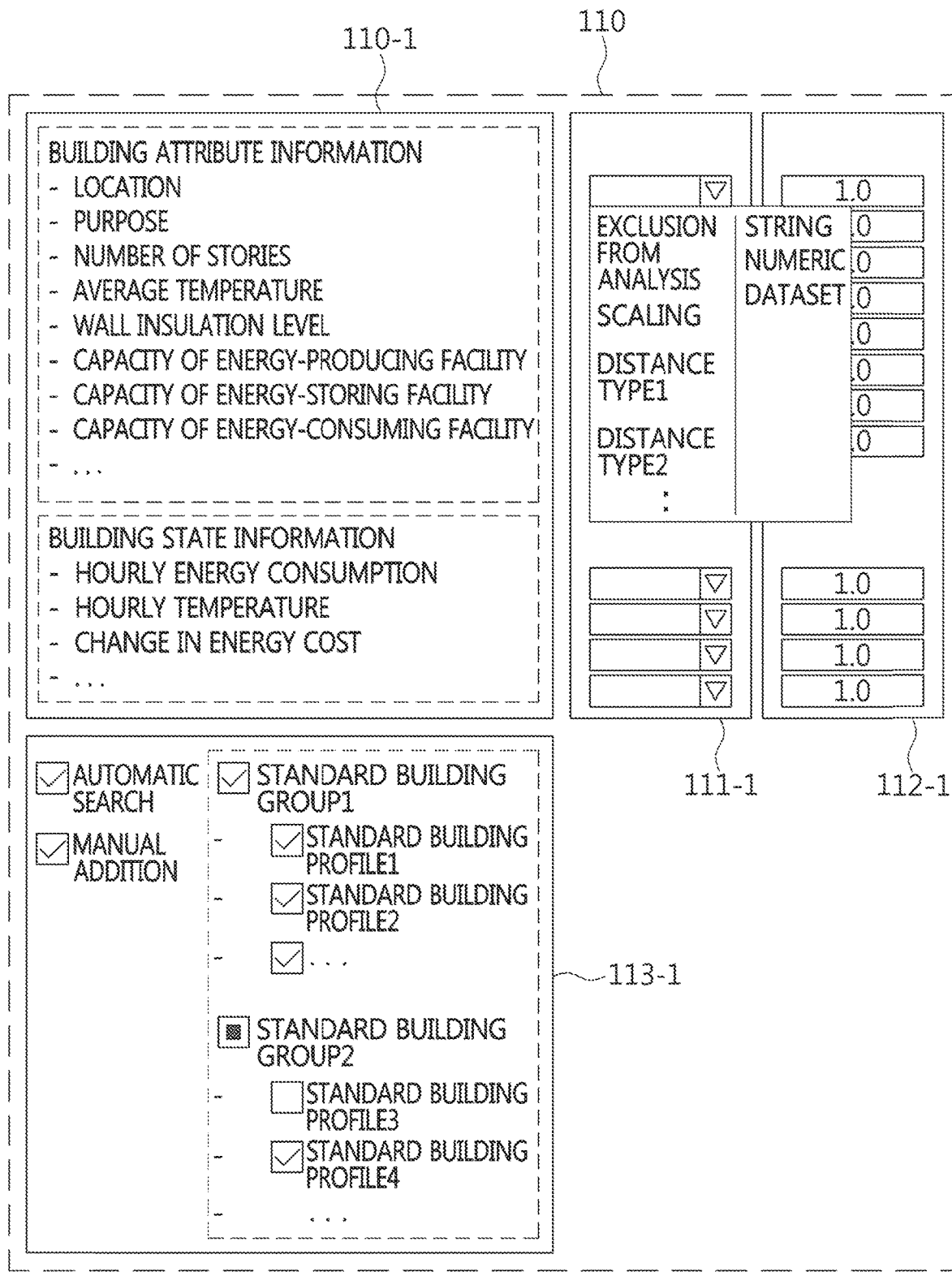
FIG. 11 is a view that shows a user interface of a configuration unit according to an embodiment of the present invention.

FIG. 11 is a view that shows a user interface of the configuration unit according to an embodiment of the present invention.

In FIG. 11, a user interface of the configuration unit 110 according to an embodiment of the present invention is illustrated.

Objects output via the user interface of the configuration unit 110 may include a property list object 110-1, an analysis target property-setting object 111-1, a property weight-setting object 112-1, and a comparison target profile-setting object 113-1.

The property list object 110-1 may display a list of properties included in a building information model.

Here, the property list object 110-1 may include a category and a subcategory in which properties are included and the values of the properties.

The analysis target property-setting object 111-1 may receive information for setting the type of a property, information about whether to include the property in analysis, and an analysis method for each property.

Here, the analysis target property-setting object 111-1 may be managed by the analysis target property-setting unit 111.

The property weight-setting object 112-1 may receive a weight for each property.

Here, the property weight-setting object 112-1 may be managed by the property-weight-setting unit 112.

The comparison target profile-setting object 113-1 may receive settings for requesting and acquiring a standard building profile.

Here, in the comparison target profile-setting object 113-1, automatic search depending on preset conditions may be set, and manual addition may be set in order to enable a user to manually select a standard building.

Here, when automatic search is set in the comparison target profile-setting object 113-1, a standard building group may be selected depending on preset conditions.

Here, when manual addition is set in the comparison target profile-setting object 113-1, a standard building group and a standard building profile may be selected by a user.

Here, the comparison target profile-setting object 113-1 may be managed by the comparison target profile-setting unit 113.

FIG. 12 is a view that shows a distance calculation algorithm according to an embodiment of the present invention.

In FIG. 12, a distance calculation algorithm used by the distance calculation unit 122 according to an embodiment of the present invention is illustrated.

A property name represents a property included in a building information model.

A property type may be the data type of a property.

Here, the property type may be any one of a string, a number, and a dataset.

The string may be text-based information for representing a building purpose, a climate, and the like.

The number may be numeric data for representing the number and consumption rates of facilities, and the like.

The dataset may be a set of numeric data for representing real-time energy consumption and the like.

A distance type may represent a method for comparing the value of a property of a building information model with that of a standard building profile.

The value of a distance type includes information about whether a corresponding property is included in the calculation of a total distance, information about whether the corresponding property is used for scaling rather than distance calculation, and a distance calculation method when the corresponding property is used for distance calculation.

Whether to apply scaling may indicate whether the corresponding property is to be corrected using scaling information.

For example, if the energy consumption of a target building is compared with that of a standard building, it is predicted that the number of stories and the area of the buildings will directly affect energy consumption. In this case, for objective analysis, properties may be corrected using scaling information to which information about the number of stories and the area is applied.

A weight may be used to change influences of a property.

Because the influence of a property differs respectively in a building information model and a standard building profile, a result of calculation of the distance of the property may be corrected using a weight.

The distance calculation unit 122 may calculate a distance for each property depending on the settings.

The less the distance value, the more similar two properties are, but the greater the distance value, the more different the two properties are.

The distance calculation unit 122 may first calculate a local information scaling value.

Here, the distance calculation unit 122 may calculate a local information scaling value using the value of a property of the target building, the value of the property of the standard building, and a weight function, as shown in Equation (1):

$$S_i = f_{S,i}(TP_i, SP_i, \alpha_i) \quad (1)$$

where i denotes the index of a property, $S_i$ denotes a local information scaling value, $TP_i$ is the value of the corresponding property of a target building, $SP_i$ is the value of the corresponding property of a standard building, $\alpha_i$ denotes a weight, and $f_{S,i}(\ )$ denotes an equation for calculating the local information scaling value using the corresponding property.

Here, the distance calculation unit 122 may calculate the local information scaling value by multiplying the weight by the ratio between the two properties, as shown in Equation (2):

$$S_4 = \alpha_4 \times SP_4 / TP_4 \quad (2)$$

where $S_4$ denotes a local information scaling value for property 4, $TP_4$ denotes the value of property 4 of a target building, $SP_4$ denotes the value of property 4 of a standard building, and $\alpha_4$ denotes a weight.

Also, the distance calculation unit 122 may calculate a global information scaling value using local information scaling values calculated for respective properties, as shown in Equation (3):

$$S = f_S(S_1, S_2, \ldots, S_N) \quad (3)$$

where S denotes a global information scaling value, $S_1$ to $S_N$ denote local information scaling values for respective properties, N denotes the number of properties, and $F_S(\ )$ denotes an equation for calculating the global information scaling value.

Here, the distance calculation unit 122 may calculate the global information scaling value by multiplying the calculated local information scaling values, as shown in Equation (4):

$$S = \Pi_{i=1}^{N} S_i \quad (4)$$

where S denotes a global information scaling value, i denotes an index of each property, $S_i$ denotes a local information scaling value by each property, and N denotes the number of properties.

Also, the distance calculation unit 122 may calculate a local information distance for a property using at least one of the global information scaling value and a weight, as shown in Equation (5):

$$D_i = f_{D,i}(TP_i, SP_i, \alpha_i) \quad (5)$$

where i denotes an index of a property, $D_i$ denotes a local information distance, $TP_i$ denotes the value of the corresponding property of a target building, $SP_i$ denotes the value of the corresponding property of a standard building, S denotes a global information scaling value, $\alpha_i$ denotes a weight, and $f_{D,i}(\ )$ denotes an equation for calculating the local information distance of the corresponding property.

As shown in FIG. 12, the local information distance may be calculated using various equations.

That is, the distance calculation unit 122 may calculate a local information distance using a distance calculation equation based on the type of the property.

Here, when the type of the property (data type) is not a number but a string, a local information distance may be calculated in such a way that, using an XOR function, 1 is input if the string values of two properties are equal to each other, but 0 is input if they are different, and a weight is multiplied by the input value, as shown in Equation (6):

$$D_2 = \alpha_2 \delta_{TP2, SP2} \quad (6)$$

where $D_2$ denotes a local information distance of property 2, $TP_2$ denotes the value of property 2 of a target building, $SP_2$ denotes the value of property 2 of a standard building, $\alpha_2$ denotes a weight, and $\delta$ denotes an XOR function.

Also, when the type of a property is a number, the distance calculation unit 122 may calculate a local information distance by multiplying a weight by a difference between the values of two properties, as shown in Equation (7):

$$D_5 = \alpha_5 |S \times TP_5 - SP_5| \quad (7)$$

where $D_5$ denotes a local information distance of property 5, $TP_5$ denotes the value of property 5 of a target building, $SP_5$ denotes the value of property 5 of a standard building, S denotes a global information scaling value, and $\alpha_5$ denotes a weight.

Also, when the type of a property is a dataset, the distance calculation unit 122 uses an algorithm for calculating a distance, such as the Manhattan distance, the Euclidean distance, the Chebyshev distance, the Minkowski distance, and the like, as shown in FIG. 12.

For example, the distance calculation unit 122 may calculate a local information distance for a dataset using the Minkowski distance calculation algorithm, as shown in Equation (8):

$$D_{10} = \alpha_{10}(\Sigma_{j=1}^{M_{10}} |S \times TP_{10,j} - SP_{10,j}|^{p_{10}})^{1/p_{10}} \quad (8)$$

where $D_{10}$ denotes a local information distance of property 10, $M_{10}$ denotes the largest index of a dataset of property 10, j denotes an index of a value in the dataset of property 10, $TP_{10,j}$ denotes a value corresponding to the j-th index of the dataset of property 10 of a target building, $SP_{10,j}$ denotes a value corresponding to the j-th index of the dataset of property 10 of a standard building, S denotes a global information scaling value, $p_{10}$ denotes the Minkowski distance order, and $\alpha_{10}$ denotes a weight.

Also, the distance calculation unit 122 may calculate a global information distance using the local information distances for the respective properties, as shown in Equation (9):

$$D = f_D(D_1, D_2, \ldots, D_N) \quad (9)$$

where D denotes a global information distance, $D_1$ to $D_N$ denote local information distances by respective properties, N denotes the number of properties, and $f_D(\ )$ denotes an equation for calculating the global information distance.

Here, the distance calculation unit 122 may calculate a global information distance for a dataset of local information distances using the Minkowski distance calculation algorithm, as shown in Equation (10):

$$D = (\Sigma_{i=1}^{N} D_i^P)^{1/P} \quad (10)$$

where D denotes a global information distance, i denotes an index of each property, $D_i$ denotes a local information distance of each property, N denotes the number of properties, and p denotes the Minkowski distance order.

Figure 13:
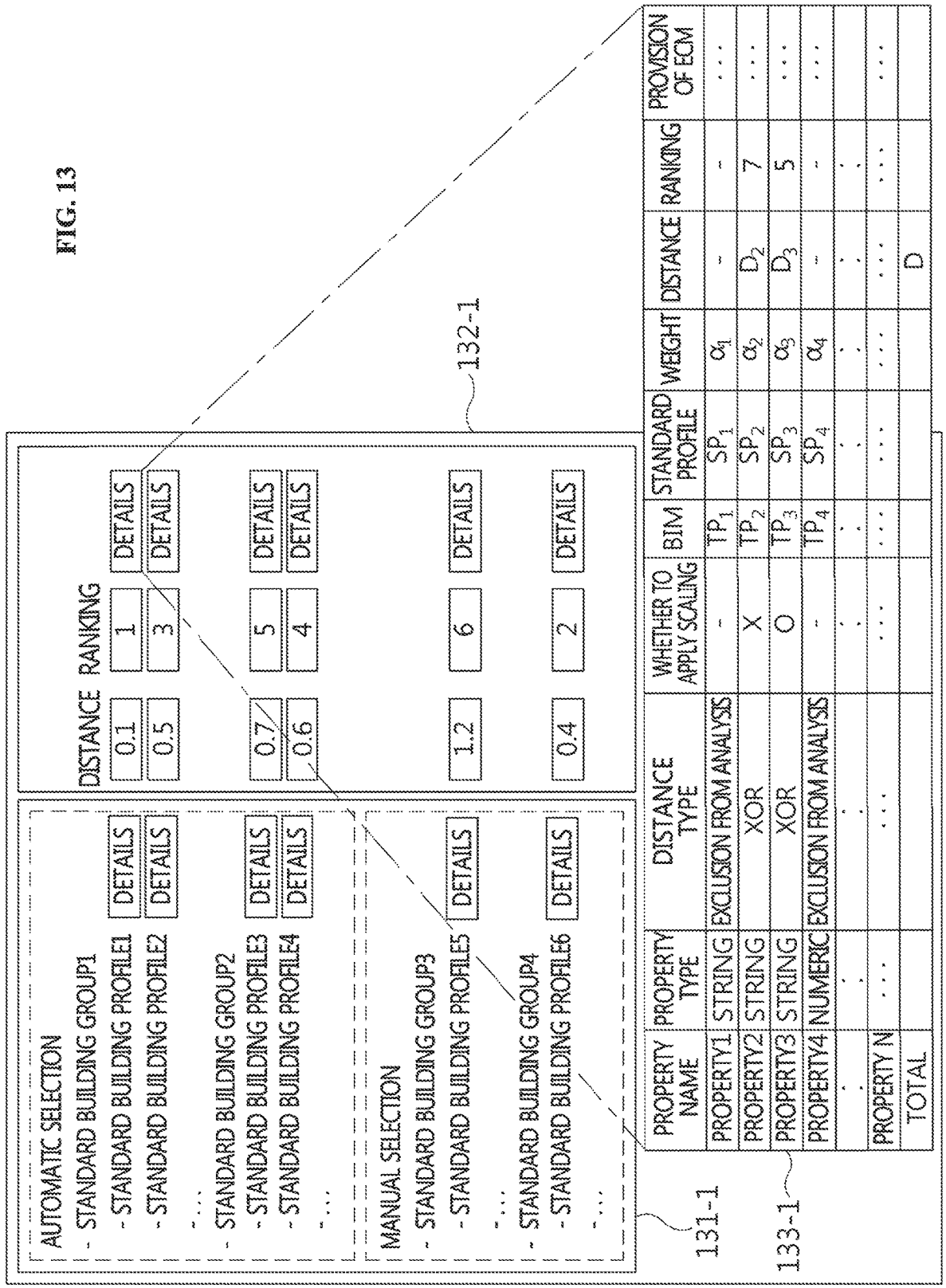
FIG. 13 is a view that shows a user interface of an output unit according to an embodiment of the present invention.

FIG. 13 is a view that shows a user interface of an output unit according to an embodiment of the present invention.

Referring to FIG. 13, the user interface of the output unit 130 according to an embodiment of the present invention may include a comparison target profile list output object 131-1, a profile comparison result output object 132-1, and a profile ECM output object 133-1.

The comparison target profile list output object 131-1 may output a list of comparison target profiles.

Here, the comparison target profile list output object 131-1 may output a list of standard building profiles for comparison with the building information model.

Here, the comparison target profile list output object 131-1 may separately output the standard building profiles selected through automatic search and the standard building profiles manually selected by a user through a manual addition option.

Here, the comparison target profile list output object 131-1 may provide the detailed information of the corresponding standard building profile by operating in conjunction with the standard building profile storage device 20.

Here, the comparison target profile list output object 131-1 may be managed by the comparison target profile list output unit 131.

The profile comparison result output object 132-1 may output the result of calculation of the distance for each standard building profile, diagnosis, analysis, and statistical information.

Here, the profile comparison result output object 132-1 may provide the ranking based on the similarity between the building information model and a standard building profile, along with detailed information.

Here, the profile comparison result output object 132-1 may be managed by the profile comparison result output unit 132.

The profile ECM output object 133-1 may provide properties of each profile.

Here, the profile ECM output object 133-1 may be provided through the detailed information of each profile in the profile comparison result output object 132-1.

Here, the profile ECM output object 133-1 may provide a property name, a property type, a distance type, information about whether to apply scaling, ranking based on a local information distance of the building information model and the standard building profile, and an ECM.

Here, the profile ECM output object 133-1 may be managed by the profile ECM output unit 133.

Figure 14:
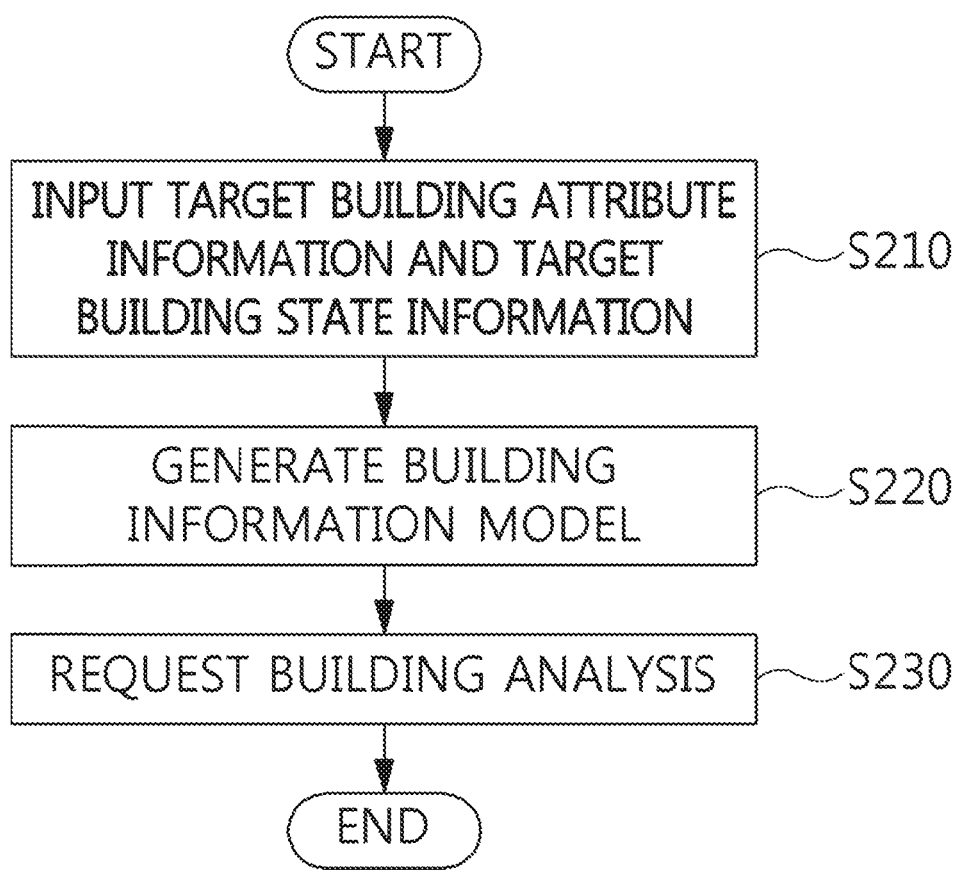
FIG. 14 is a flowchart that shows a method for generating a building information model according to an embodiment of the present invention.

FIG. 14 is a flowchart that shows a method for generating a building information model according to an embodiment of the present invention.

Referring to FIG. 14, in the method for generating a building information model according to an embodiment of the present invention, first, target building attribute information and target building state information may be input at step S210.

That is, at step S210, a user interface device 10 may receive the attribute information and the state information of a target building from a user.

Also, in the method for generating a building information model according to an embodiment of the present invention, a building information model may be generated at step S220.

That is, at step S220, the user interface device 10 may generate a building information model using the received attribute information and state information of the target building.

Also, in the method for generating a building information model according to an embodiment of the present invention, analysis of the building may be requested at step S230.

That is, at step S230, the user interface device 10 may request the building analysis apparatus 100 to analyze the target building by delivering the generated building information model of the target building thereto.

Figure 15:
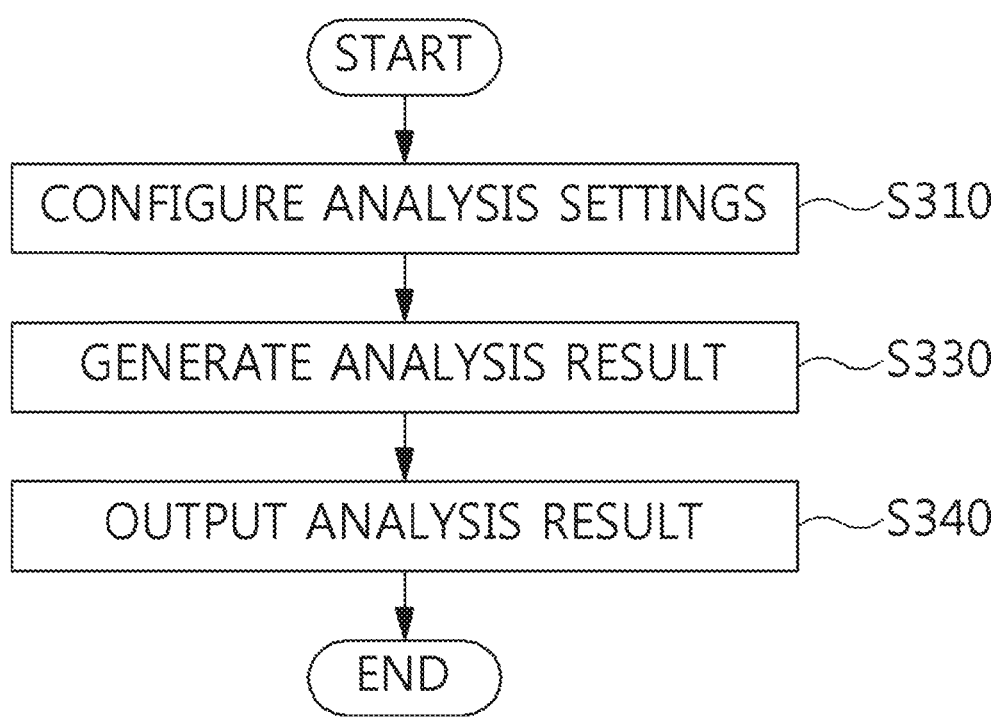
FIG. 15 is a flowchart that shows a method for analyzing building information according to an embodiment of the present invention.
Figure 16:
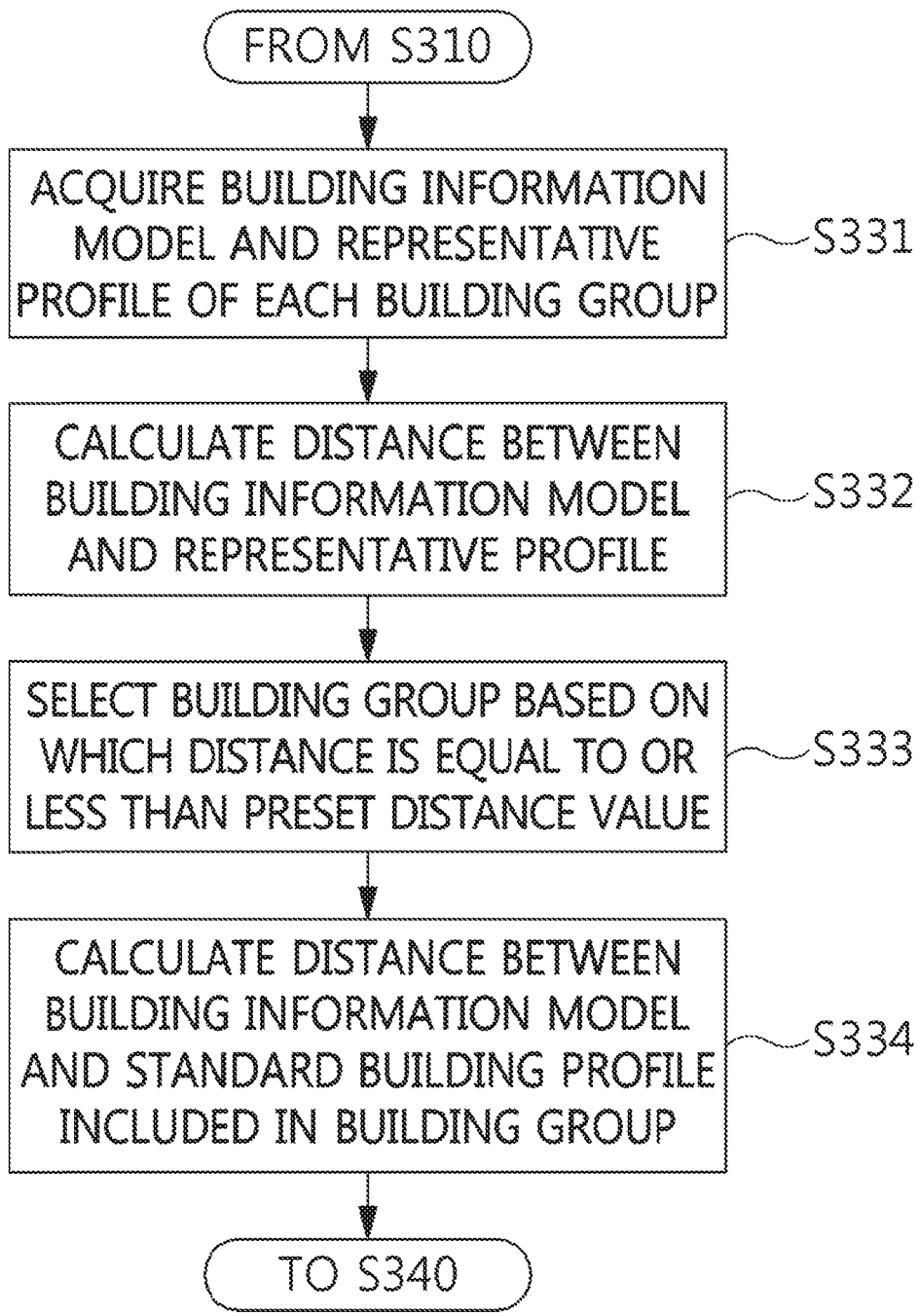
FIG. 16 is a view that specifically shows an example of the step of generating the analysis result illustrated in FIG. 15.

FIG. 15 is a flowchart that shows a building information analysis method according to an embodiment of the present invention. FIG. 16 is a view that specifically shows an example of the step of generating an analysis result, illustrated in FIG. 15.

Referring to FIG. 15, in the building information analysis method according to an embodiment of the present invention, first, building analysis settings may be configured at step S310.

That is, at step S310, analysis settings for analyzing the target building may be configured.

Here, at step S310, in order to analyze the building information model requested by the user interface device 10, the type of a property, whether to include the property in the analysis, and a method for analyzing the property may be set for each property included in the building information model.

Here, at step S310, automatic settings depending on preset conditions may be enabled, or properties may be manually configured by receiving information from a user.

Here, at step S310, a weight may be set for a property that is determined to be included in the analysis.

Here, at step S310, automatic settings depending on a preset weight may be enabled, or a weight may be manually set by receiving the weight from a user.

Here, at step S310, settings for selecting standard building profiles that are to be compared with the building information model of the target building may be configured.

Here, at step S310, automatic settings depending on preset conditions may be enabled, or settings may be manually configured by receiving information from a user.

Also, in the building information analysis method according to an embodiment of the present invention, an analysis result may be generated at step S330.

Referring to FIG. 16, at step S330, first, a building information model and representative profiles of respective building groups may be acquired at step S331.

That is, at step S331, depending on the analysis settings, the building information model may be acquired from the user interface device 10 by requesting the same, and the representative profiles of building groups may be acquired from the standard building profile storage device 20.

Also, at step S330, the distance between the building information model and the representative profile may be calculated at step S332.

That is, at step S332, the main calculation unit 121 may request the distance calculation unit 122 to calculate a distance based on the similarity between the acquired building information model and the representative profiles of building groups by delivering the building information model and the representative profiles of building groups thereto.

Here, at step S332, the distance calculation unit 122 may calculate the distance based on the similarity between the building information model and the standard building profile.

Here, at step S332, the distance calculation unit 122 may calculate the distance based on the similarity between the building information model and the representative profile of each building group, which are delivered from the main calculation unit 121.

Here, at step S332, the distance calculation unit 122 may deliver the result of calculation of the distance based on the similarity to the main calculation unit 121.

Also, at step S330, a building group may be selected at step S333 by comparing the calculated distance with a preset distance value.

That is, at step S333, the main calculation unit 121 may select a building group corresponding to a representative profile based on which the calculated distance is equal to or less than the preset distance value.

Here, at step S333, the main calculation unit 121 may acquire the standard building profile included in the selected building group from the standard building profile storage device 20 by requesting the same.

Here, at step S333, the main calculation unit 121 may request the distance calculation unit 122 to calculate a distance based on the similarity between the building information model and the standard building profile included in the corresponding building group by delivering the building information model and the standard building profile included in the corresponding building group thereto.

Also, at step S330, the distance between the building information model and the standard building profile included in the corresponding building group may be calculated at step S334.

That is, at step S334, the distance calculation unit 122 may calculate the distance between the building information model and the standard building profile included in the corresponding building group.

Here, at step S334, the distance calculation unit 122 may deliver the result of calculation of the distance based on the similarity to the main calculation unit 121.

Here, at step S334, the main calculation unit 121 may generate an analysis result using the acquired distance calculation result.

Here, at step S334, the main calculation unit 121 may deliver the generated analysis result to the output unit 130.

Also, in the method for analyzing a building according to an embodiment of the present invention, the analysis result may be output at step S340.

That is, at step S340, the result of analysis of the target building may be output.

Here, at step S340, the analysis result may be sent to the user interface device 10.

Here, at step S340, information about the standard building profiles for comparison with the target building may be output using the analysis result.

Here, at step S340, diagnosis, analysis and statistical information acquired by comparing the target building with the standard building may be output based on the analysis result.

Here, at step S340, an Energy Conservation Measure (ECM) for normalizing the state of the target building may be provided based on the analysis result.

Figure 17:
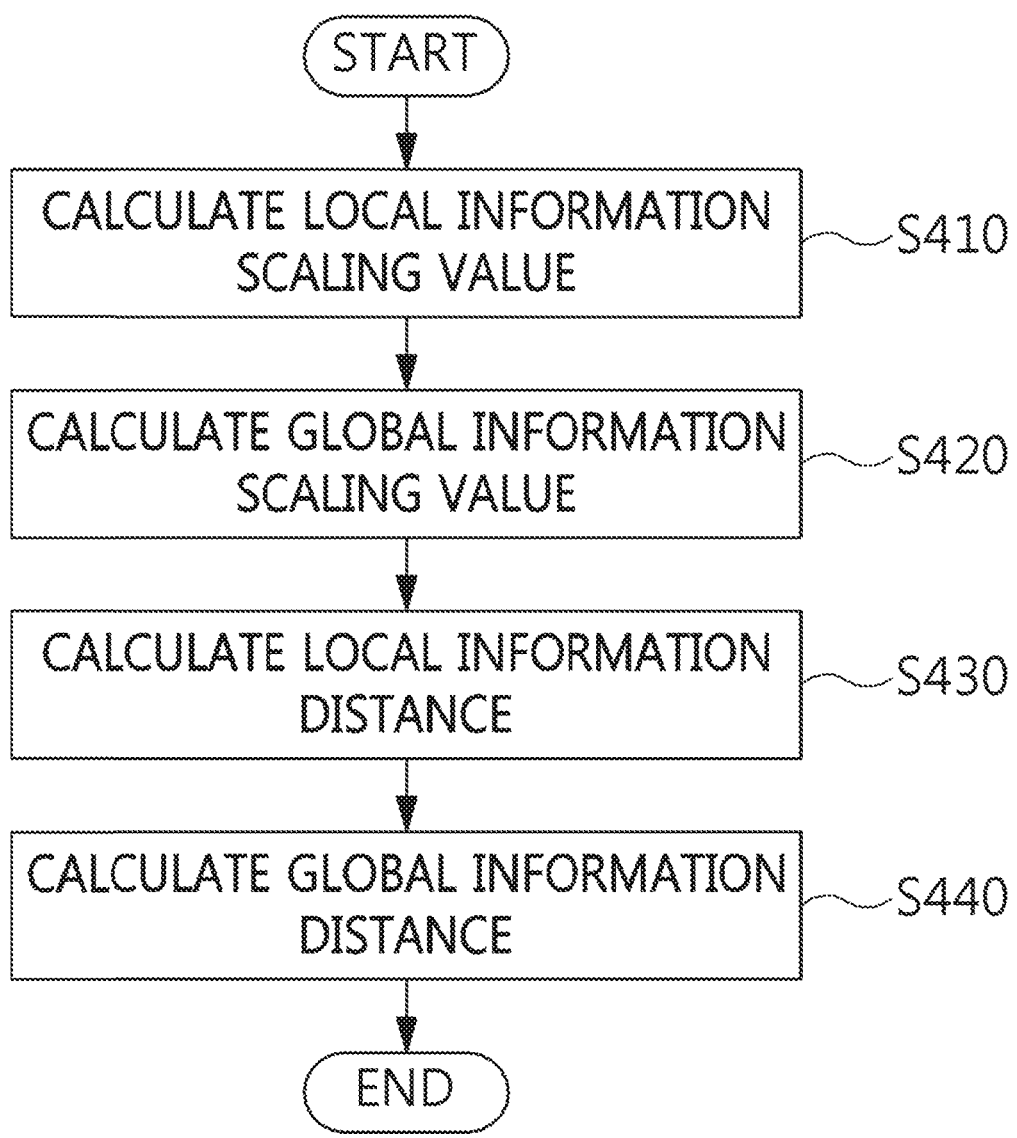
FIG. 17 is a flowchart that shows a method for calculating a distance based on similarity according to an embodiment of the present invention.

FIG. 17 is a flowchart that shows a method for calculating a distance based on similarity according to an embodiment of the present invention.

The method for calculating a distance based on similarity, illustrated in FIG. 17, may be used for the method for calculating the distance between the building information model and the representative profile at step S332 and for the method for calculating the distance between the building information model and the standard building profile included in the selected building group at step S334.

Referring to FIG. 17, in the method for calculating a distance based on similarity according to an embodiment of the present invention, first, a local information scaling value may be calculated at step S410.

That is, at step S410, a local information scaling value may be calculated using the value of a property of the target building, the value of the property of the standard building, and a weight function, as shown in Equation (1).

Here, at step S410, the local information scaling value may be calculated by multiplying the weight by the ratio between the values of two properties, as shown in Equation (2).

Also, in the method for calculating a distance based on similarity according to an embodiment of the present invention, a global information scaling value may be calculated at step S420.

That is, at step S420, the global information scaling value may be calculated using local information scaling values calculated for the respective properties, as shown in Equation (3).

Here, at step S420, the global information scaling value may be calculated by multiplying the calculated local information scaling values, as shown in Equation (4).

Also, in the method for calculating a distance based on similarity according to an embodiment of the present invention, a local information distance may be calculated at step S430.

That is, at step S430, the local information distance for a property may be calculated using at least one of the global information scaling value and a weight, as shown in Equation (5).

Here, at step S430, the local information distance may be calculated using a distance calculation equation based on the type of the property.

Here, at step S430, when the type of the property (data type) is not a number but a string, a local information distance may be calculated in such a way that, using an XOR function, 1 is input if the string values of two properties are equal to each other, but 0 is input if they are different, and a weight is multiplied by the input value, as shown in Equation (6).

Here, at step S430, when the type of the property is a number, the local information distance may be calculated by multiplying the weight by the difference between the values of two properties, as shown in Equation (7).

Here, at step S430, when the type of the property is a dataset, an algorithm for calculating a distance, such as the Manhattan distance, the Euclidean distance, the Chebyshev distance, the Minkowski distance, and the like, may be used as shown in FIG. 12.

For example, at step S430, when the type of the property is a dataset, the local information distance for the dataset may be calculated using the Minkowski distance calculation algorithm, as shown in Equation (8).

Also, in the method for calculating a distance based on similarity according to an embodiment of the present invention, a global information distance may be calculated at step S440.

That is, at step S440, a global information distance may be calculated using the local information distances for the respective properties, as shown in Equation (9).

Here, at step S440, the global information distance for a dataset of the local information distances may be calculated using the Minkowski distance calculation algorithm, as shown in Equation (10).

Figure 18:
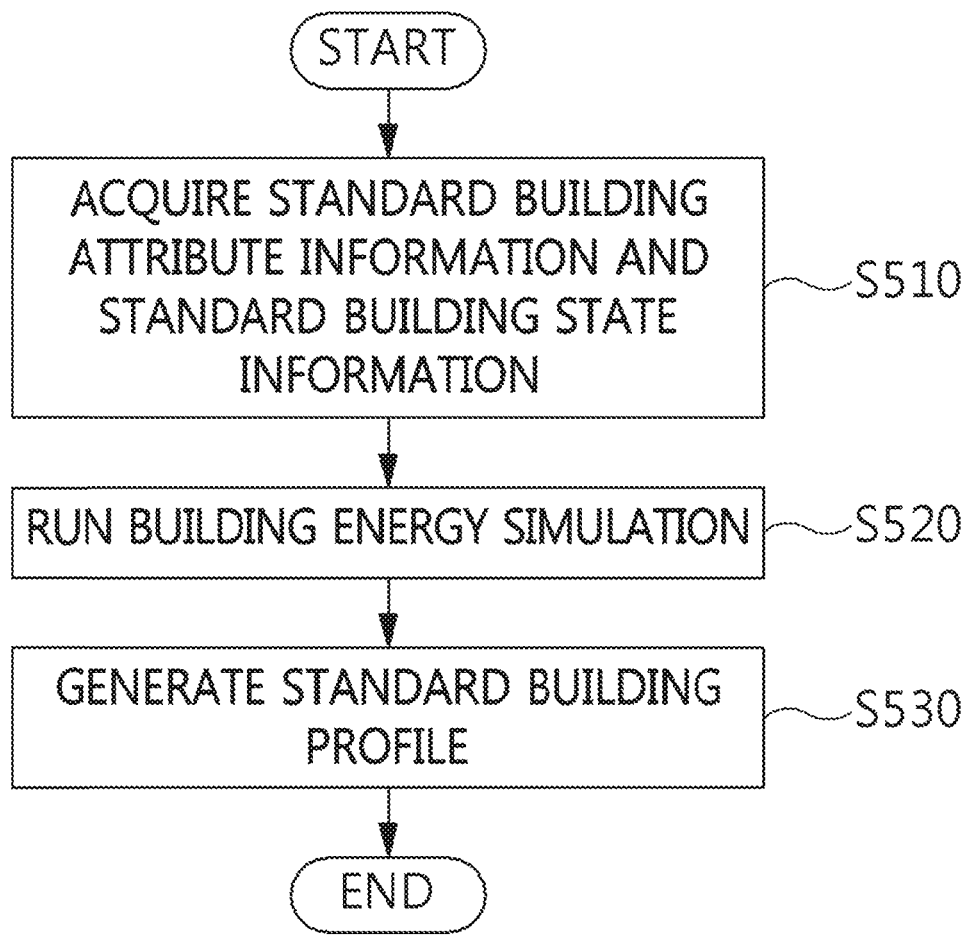
FIG. 18 is a flowchart that shows a method for generating a standard building profile according to an embodiment of the present invention.

FIG. 18 is a flowchart that shows a method for generating a standard building profile according to an embodiment of the present invention.

Referring to FIG. 18, in the method for generating a standard building profile according to an embodiment of the present invention, first, standard building attribute information and standard building state information may be acquired at step S510.

That is, at step S510, the simulation unit 23 may acquire the standard building attribute information and the standard building state information from the standard building attribute information database unit 21 and the standard building state information database unit 22, respectively.

Here, at step S510, the simulation unit 23 may generate simulation input data by combining the acquired standard building attribute information with the acquired standard building state information.

Also, in the method for generating a standard building profile according to an embodiment of the present invention, a building energy simulation may be run at step S520.

That is, at step S520, a building energy consumption prediction result may be generated whereby the simulation unit 23 runs a building energy simulation with the simulation input data.

Also, in the method for generating a standard building profile according to an embodiment of the present invention, a standard building profile may be generated at step S530.

That is, at step S530, the simulation unit 23 may generate the standard building profile by combining the simulation input data with the building energy consumption prediction result.

Here, at step S530, the simulation unit 23 may generate multiple standard building profiles using various combinations of the standard building attribute information and the standard building state information.

Here, at step S530, the simulation unit 23 delivers the standard building profiles to the standard building profile database unit 24 so as to be stored therein.

Here, at step S350, the simulation unit 23 may send the standard building profiles to the building analysis apparatus 100.

Figure 19:
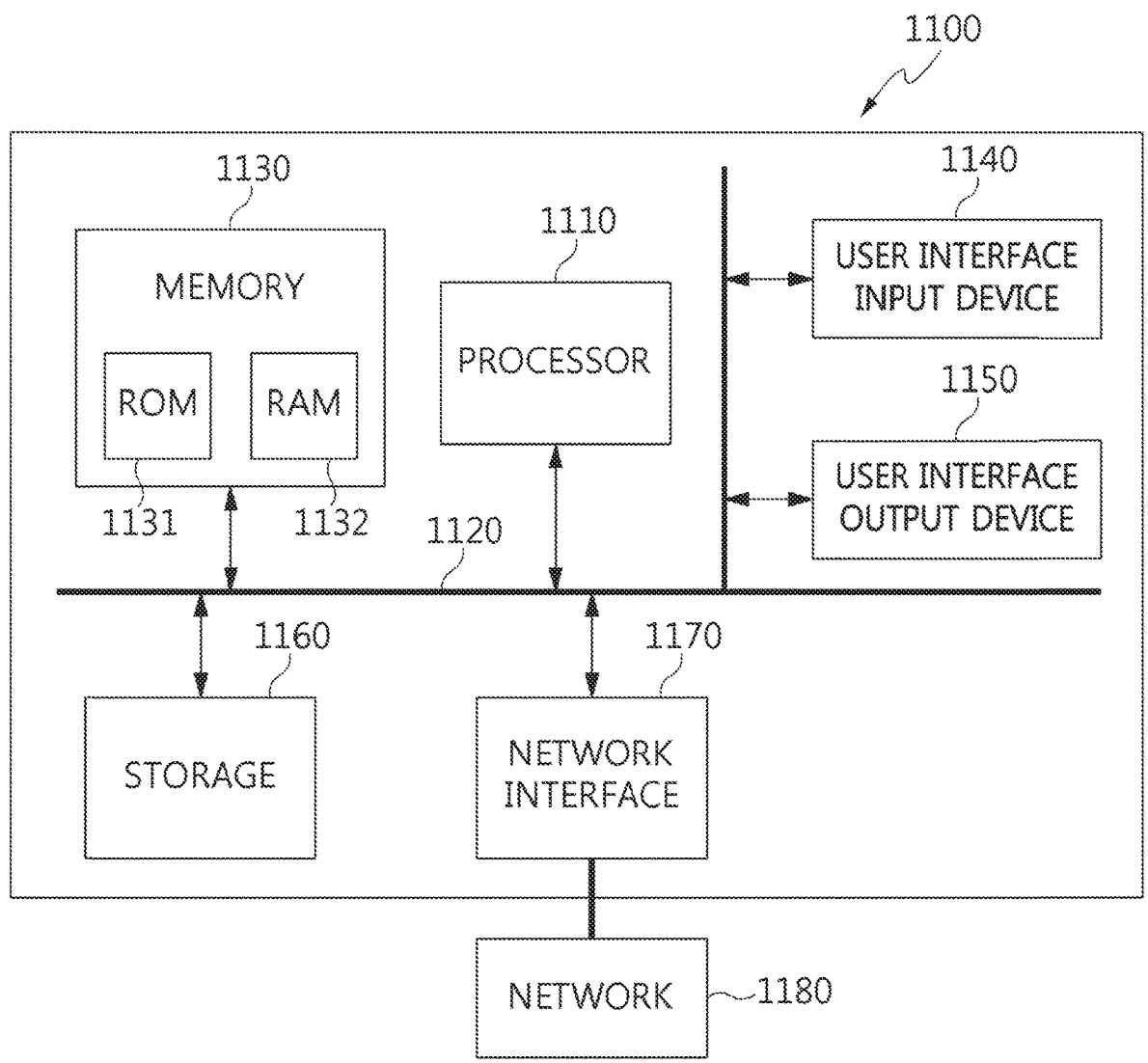
FIG. 19 is a block diagram that shows a computer system according to an embodiment of the present invention.

FIG. 19 is a block diagram that shows a computer system according to an embodiment of the present invention.

Referring to FIG. 19, the user interface device 10, the standard building profile storage device 20, and the building analysis apparatus 100 according to an embodiment of the present invention may be implemented in a computer system 1100 such as a computer-readable recording medium. As illustrated in FIG. 19, the computer system 1100 may include one or more processors 1110, memory 1130, a user interface input device 1140, a user interface output device 1150, and storage 1160, which communicate with each other via a bus 1120. Also, the computer system 1100 may further include a network interface 1170 connected with a network 1180. The processor 1110 may be a central processing unit or a semiconductor device for executing processing instructions stored in the memory 1130 or the storage 1160. The memory 1130 and the storage 1160 may be various types of volatile or nonvolatile storage media. For example, the memory may include ROM 1131 or RAM 1132.

According to the present invention, a building state may be precisely diagnosed through comparison and analysis of building information.

Also, according to the present invention, building information may be precisely analyzed using a standard building profile based on a simulation.

Also, according to the present invention, the expenses for constructing a building management system may be reduced through building information analysis.

Also, according to the present invention, a method for resolving the abnormal state of a building and reducing energy consumption may be provided.

As described above, the apparatus and method for analyzing a building according to the present invention are not limitedly applied to the configurations and operations of the above-described embodiments, but all or some of the embodiments may be selectively combined and configured, so that the embodiments may be modified in various ways.

What is claimed is:

1. An apparatus for analyzing a building, comprising:
at least one processor that processes computer executable program code embodied in non-transitory computer readable storage media, the computer executable program code comprising:
configuration program code that configures analysis settings for analyzing a target building;
calculation program code that calculates a distance based on a similarity by acquiring information about the target building and information about a standard building depending on the analysis settings and that generates a result of analysis of the target building using the distance; and
output program code that outputs the result of analysis of the target building, wherein the calculation program code further calculates a local information scaling value using a weight and a ratio between a value of a property of the target building and that of the standard building;

further comprising the results of the analysis being used for building management in order to check and optimize energy consumption in real time.

2. The apparatus of claim 1, wherein the information about the target building corresponds to a Building Information Model (BIM) generated using attribute information and state information of the target building.

3. The apparatus of claim 1, wherein the information about the standard building is a standard building profile generated using attribute information and state information of the standard building for obtaining a similarity with the target building.

4. The apparatus of claim 3, wherein the standard building profile is generated by combining a building energy consumption prediction result with the attribute information and the state information of the standard building.

5. The apparatus of claim 4, wherein the building energy consumption prediction result is generated by running a building energy simulation with data acquired by combining the attribute information and the state information of the standard building.

6. The apparatus of claim 1, wherein the calculation program code calculates a distance based on similarities between the building information model of the target building and representative profiles that represent building groups, among standard building profiles of the standard building.

7. The apparatus of claim 6, wherein the calculation program code selects a building group corresponding to a representative profile based on which the calculated distance is equal to or less than a preset value.

8. The apparatus of claim 7, wherein the calculation program code generates the analysis result by calculating a distance based on the similarities between the building information model of the target building and standard building profiles included in the selected building group.

9. The apparatus of claim 8, wherein the calculation program code calculates the distance based on the similarity by applying at least one of scaling information and a weight to a value acquired by comparing each property of the building information model of the target building with that of the standard building.

10. The apparatus of claim 1, wherein the calculation program code calculates a global information scaling value by multiplying local information scaling values calculated for respective properties.

11. The apparatus of claim 10, wherein the calculation program code calculates a local information distance using a distance calculation equation based on a type of the property.

12. The apparatus of claim 11, wherein, when the type of the property is a string, the calculation program code calculates the local information distance depending on whether string values of two properties are equal to each other using an XOR function.

13. The apparatus of claim 11, wherein, when the type of the property is a number, the calculation program code calculates the local information distance by multiplying a weight by a difference between values of two properties.

14. The apparatus of claim 11, wherein, when the type of the property is a dataset, the calculation program code calculates the local information distance for a dataset using a Minkowski distance calculation algorithm.

15. The apparatus of claim 11, wherein the calculation program code calculates a global information distance for a dataset of the local information distances calculated for the respective properties using a Minkowski distance calculation algorithm.

16. The apparatus of claim 1, wherein the output program code provides an Energy Conservation Measure (ECM) for the target building based on the analysis result.

17. A method for analyzing a building, in which an apparatus for analyzing a building is used, comprising:
processing computer executable program code embodied in non-transitory computer readable storage media by at least one processor, the computer executable program code comprising:
program code that configures analysis settings for analyzing a target building;
program code that calculates a distance based on a similarity by acquiring information about the target building and information about a standard building depending on the analysis settings, and that generates a result of analysis of the target building using the distance; and
program code that outputs the result of analysis of the target building,
wherein calculating the distance includes calculating a local information scaling value using a weight and a ratio between a value of a property of the target building and that of the standard building;
further comprising the results of the analysis being used for building management in order to check and optimize energy consumption in real time.

18. The method of claim 17, wherein the program code that generates the result comprises program code that calculates the distance based on the similarity by applying at least one of scaling information and a weight to a value acquired by comparing each property of a building information model of the target building with that of the standard building.

19. The method of claim 18, wherein the program code that generates the result comprises program code that calculates the distance based on the similarity using a distance calculation equation based on a type of the property.

* * * * *